United States Patent [19]
Kao et al.

[11] Patent Number: 5,493,245
[45] Date of Patent: Feb. 20, 1996

[54] LOW POWER HIGH SPEED LEVEL SHIFT CIRCUIT

[75] Inventors: Wen-pin Kao, Taipei; Maio-Ling Lin, Tainan, both of Taiwan

[73] Assignee: United Microelectronics Corp., Hsin-Chu, Taiwan

[21] Appl. No.: 368,517

[22] Filed: Jan. 4, 1995

[51] Int. Cl.⁶ .......................................... H03K 19/0185
[52] U.S. Cl. .............................. 327/333; 326/80; 326/81
[58] Field of Search .................................. 327/333, 319, 327/379, 390; 326/80, 81, 83, 68.71; 375/220

[56] References Cited

U.S. PATENT DOCUMENTS 5,304,867   4/1994   Morris ........................................ 327/333
5,408,147   4/1995   Yarbrough et al. ......................... 326/68

FOREIGN PATENT DOCUMENTS 1276821   11/1989   Japan ......................................... 326/71

*Primary Examiner*—Timothy P. Callahan
*Assistant Examiner*—Eunja Shin
*Attorney, Agent, or Firm*—Dykema Gossett

[57] ABSTRACT

An improved voltage level shift circuit that requires low power consumption, capable of driving a high voltage range and providing a high data transfer rate and a power down function utilizes a first set of CMOS transistors as switching device, a second set of CMOS transistors as feedback device and a third set of CMOS to drive the voltage range.

9 Claims, 3 Drawing Sheets

LOW POWER HIGH SPEED LEVEL SHIFT CIRCUIT

FIELD OF THE INVENTION

The present invention generally relates to a level shift circuit utilized in a computer system and more particularly, relates to a low power consumption high speed level shift circuit for use in a high voltage shift range.

BACKGROUND OF THE INVENTION

In the numerous electronics circuits used in a computer system, it is frequently required to use a protocol or an interface standard in between a personal computer and a modem. Such a protocol is an input/output product for communication between the two essential computer elements. One of such interface standard is available from the United Microelectronics Corporation of Hsin-chu, Taiwan, under a product code of RS232. A protocol unit such as RS232 operates in between a voltage range of −12 V to +12 V. A personal computer which normally operates in between 0 V to 5 V must drive this interface standard at a much higher voltage range which in turn communicates with a modem at 9,600 bps (bits per second).

In order for a personal computer, i.e. at 0 to 5 V range, to drive an interface standard that operates in the −12 V to +12 V range, a level shift circuit must be used in between the two units.

In a conventional level shift circuit, a level shift can be executed only if a specific relationship is in existence between the voltages to be shifted. Other conventional level shift circuits, even though they do not require the special relationship between the voltages to be shifted, have a constant DC current flowing through the circuits and therefore consume a high power.

For instance, FIG. 1 shows a conventional level shift circuit 10 in which a set of voltages $V_1$ and $V_2$ is to be shifted to another set of voltages $V_3$ and $V_4$. In this conventional level shift circuit, high voltage CMOS transistors of both types—PMOS (12 and 14) and NMOS (16 and 18) are used. For the circuit shown in FIG. 1, $V_1$, $V_3 > V_2$, $V_4$ and also $V_2 < V_4 + V_{th}$ (MN1), and $V_2 < V_4 + V_{th}$ (MN2). When the input potential I is $V_1$, the control potential I' for MN2 18 is $V_2$. The NMOS 16 (MN1) is on while the NMOS 18 (MN2) is off. (This is because $V_2 < V_4 + V_{th}$ (MN2).) Since MN1 16 is on, the control potential V for MP2 14 equals $V_4$, MP2 14 is on, and the output potential 0 equals $V_3$. When I=$V_2$, I'=$V_1$, MN1 is off because $V_2 < V_4 + V_{th}$ (MN1) and MN2 is on. Therefore, $V_4$ is applied to MP1 12, it is being turned on and V=$V_3$.

When the input potential I changes from $V_1$ to $V_2$, I' changes from $V_2$ to $V_1$. MN2 is on while MN1 is off. The voltage at V has an original value of $V_4$, which turns on MP2 and MN2 simultaneously. The voltage at 0 point gradually decreases, such that MP1 is gradually turned on. This makes the voltage at V point increase gradually from $V_4$, such that MP2 is gradually turned off. Until a stable condition is reached, the voltage at 0 point is $V_4$, MP1 is completely turned on, the voltage at the V point is $V_3$ such that MP2 is completely turned off. Since the time it takes to turn off MP2 is long, the voltage change is very slow. The same phenomenon occurs when I is changed from $V_2$ to $V_1$. The voltages at I, I', V and 0 plotted against time are shown in FIG. 2 that clearly demonstrates the slowness of $V_3/V_4$ and $V_4/V_3$ voltage shifting.

This conventional level shift circuit therefore has several shortcomings. First, the change in the voltage is very slow and therefore the data transfer rate is slow. Secondly, in order to shift the voltage level, the condition of $V_2 < V_4 + V_{th}$ (MN1) and $V_2 < V_4 + V_{th}$ (MN2) must be satisfied. Thirdly, the power consumption of the circuit is very large. With the present level shift circuit, it is possible to drive a 0 to 12 V circuit by a 0 to 5 V circuit. However, the 0 to 5 V circuit cannot be used to drive a −12 V to +12 V circuit.

Another conventional level shift circuit utilizing a comparator to generate the voltage shift is shown in FIG. 3. In the circuit, the voltage of $V_1$ and $V_2$ are shifted to $V_3$ and $V_4$. $V_1$, $V_3 > V_2$, $V_4$. The voltage of $V_a$ which generates the current source must satisfy $V_a > V_4$. When the voltage at point I exceeds $V_{ref}$, $V_b$ is the lower voltage, by using a threshold voltage to adjust an inverter such that the output voltage at point 0 is the high voltage $V_3$. In contrast, when the voltage at point I is less than $V_{ref}$, $V_b$ is the higher voltage which is sent through an inverter such that the output voltage 0 becomes the lower voltage $V_4$.

In this conventional level shift circuit, even though it has the benefits of not requiring a special relationship between $V_1$, $V_2$ and $V_3$, $V_4$, the circuit consumes very high power. This is because during the generation of the referenced voltage, there is a continuing DC path and furthermore, the constant need for the current source for the comparator. These two current flows contribute to a high power consumption which is the major drawback of this conventional level shift circuit. While this level shift method has improved feature compared to the first conventional method, i.e. the circuit can drive a higher voltage range, the other drawbacks of the first conventional method still exist. This makes the circuit unsuitable for applications such as in a Green PC or for a notebook PC.

It is therefore an object of the present invention to provide an improved level shift circuit that does not have the drawbacks of the prior art level shift circuits.

It is another object of the present invention to provide an improved level shift circuit that does not require a high power consumption.

It is a further object of the present invention to provide an improved level shift circuit that is capable of data transfer at a fast rate.

It is still another object of the present invention to provide an improved level shift circuit that can drive a high voltage range such as from −12 V to +12 V by a low voltage source of from 0 to 5 V.

SUMMARY OF THE INVENTION

In accordance with the present invention, an improved level shift circuit that does not require high power consumption, that is capable of driving a high voltage range, that can provide a high data transfer is provided.

In the preferred embodiment, a series of PMOS and NMOS transistors and a capacitor is used. Specifically, a first set of PMOS and NMOS transistors is used as switching device, a second set of PMOS and NMOS transistors is used in a feedback circuit and a third set of PMOS and NMOS is used to drive the voltage range. The feedback circuit is used to prevent the gate of the output PMOS and NMOS from floating, and further utilizing a capacitor of large capacitance to increase the data transfer rate by a bootstrap effect.

BRIEF DESCRIPTIONS OF THE DRAWINGS

DETAILED DESCRIPTION OF THE PRESENT INVENTION

Figure 1:
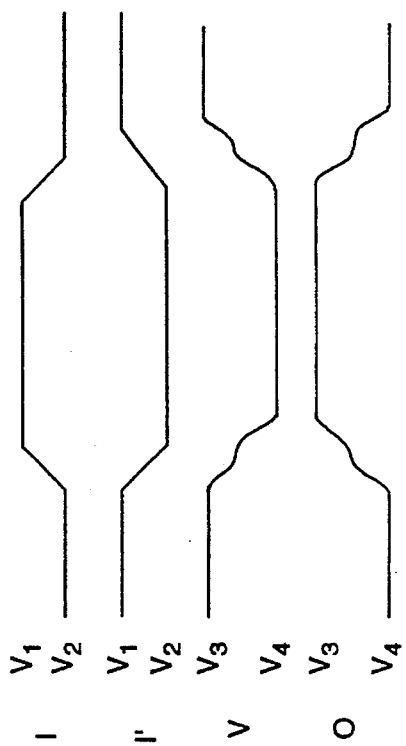
FIG. 1 is a circuit diagram showing the first conventional level shift circuit.
Figure 2:
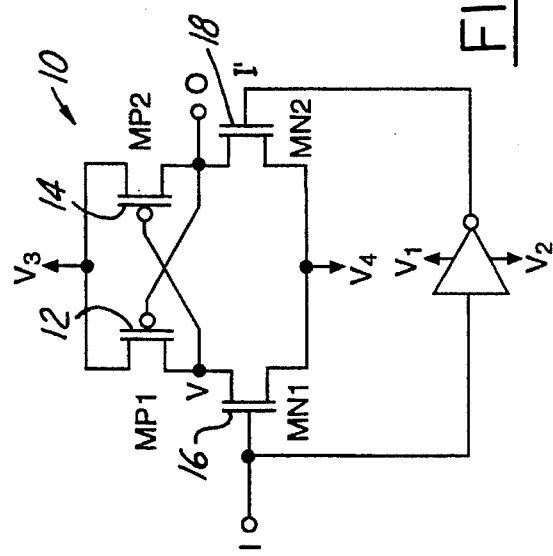
FIG. 2 is a diagram showing the voltage/time relationship of the various voltages shown in FIG. 1.
Figure 4:
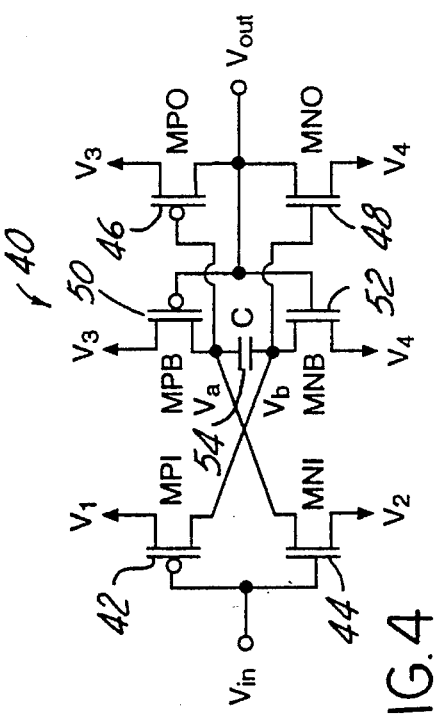
FIG. 4 is a circuit diagram showing the present invention level shift circuit.
Figure 3:
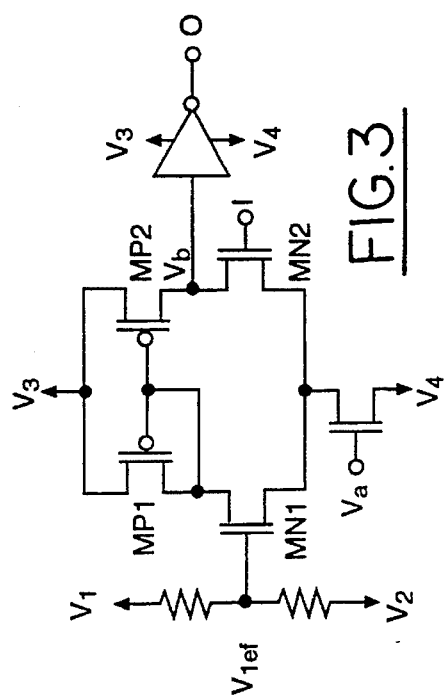
FIG. 3 is a circuit diagram showing a second conventional level shift circuit.

Referring initially to FIG. 4, where a present invention level shift circuit 40 is shown, this circuit is intended to switch the voltages of $V_1$ and $V_2$ to $V_3$ and $V_4$, where $V_1$, $V_3 > V_2$, $V_4$. The first pair PMOS 42 and NMOS 44 is used pass a switching device. A third set of PMOS 46 and NMOS 48 is used for output and for driving the next stage circuit. A second set of PMOS 50 and NMOS 52 is used as the feedback circuit to prevent the gate of 46 and 48 from floating. A large capacity capacitor 54 is used to increase the voltage shift rate by a bootstrap effect. The bootstrap effect is utilized here for its making use of a compensational feedback providing a change of the input signal source potential relative to ground by the amount equal to the output signal.

The operation of the present invention level shift circuit can be explained as follows. During a steady state, assuming that $V_{in} = V_1$ where $V_1$ is a high voltage, MNI 44 is turned on, MPI 42 is turned off. The voltage at point $V_a$ is $V_2$ such that MPO 46 is turned on. At the output point $V_{out}$, the voltage is $V_3$ which is a high voltage. Through the feedback circuit, MPB 50 is turned off, and MNB 52 is turned on. The voltage at point $V_b$ does not float. It has a value of $V_4$.

Assuming that $V_{in} = V_2$ which is a low voltage, MNI 44 is turned off and MPI 42 is turned on, the voltage at point $V_b$ is $V_1$ such that MNO 48 is turned on. The voltage at point $V_{out}$ is $V_4$ which is a low voltage. Through the feedback circuit, MNB 52 is turned off and MPB 50 is turned on. The voltage at point $V_a$ is not floating and it has a value of $V_3$. The goal of level shift of the voltages is therefore achieved.

During a transient state, assuming that $V_{in} = V_1$ that approaches $V_2$ (a high voltage approaches low voltage), MPI 42 is turned on and MNI 44 is turned off, the voltage at $V_b$ changes from the original value of $V_4$ and through the turn on of MPI 42 is switched to $V_1$. The MNI 44 is turned off, and the original $V_{out}$ is $V_3$, this makes turning off of MPB 50. At this time, the original voltage at point $V_a$ through the bootstrap effect of the capacitor 54, switches the original voltage $V_2$ at the point of $V_a$ to $V_2 + (V_1 - V_4)$. This accelerates the turn off of MPO 46 such that the transient current of MPO 46 and MNO 48 is reduced. This in turn reduces the power consumption and furthermore, accelerates the voltage shift rate. MPO 46 remains in a state of turn off such that the voltage at $V_{out}$ continues to decrease. MPB 50 is quickly turned on and MNB 52 is quickly turned off. The voltage at point $V_a$ continuing to increase until MPO 46 is completely turned off. The voltage at point $V_{out}$ achieves the value of $V_4$, while MNB 52 is completely turned off and MPG 50 is completely turned on. The voltage at point $V_a$ is increased from $V_2 + (V_1 - V_4)$ to $V_3$.

Assuming $V_{in} = V_2$ which approaches the value of $V_1$ from a low voltage to a high voltage, MNI 44 is turned on and MPI 42 is turned off. The voltage at point $V_a$ changes from the original value of $V_3$ and shifts to $V_2$ through the turn on of MNI 44. Since MPI 42 is turned off, and changing from the original value $V_3$ of $V_{out}$ to $V_4$, this turns off MNB 52. At this time, the voltage at $V_b$ through the bootstrap effect of capacitor 54, shifts from $V_1$ to $V_1 + (V_2 - V_3)$. This accelerates the turn off of MNO 48 such that the transient current of MPO 46 and MNO 48 is reduced. This leads to a low power consumption and an improved voltage shift rate. The MNO 48 continues to turn off which leads to the continuing increase of voltage at $V_{out}$ such that MPB 50 is quickly turned off and MNB 52 is quickly turned on. The voltage at point $V_b$ continues to decrease until MNO 48 is completely turned off. The voltage at point $V_{out}$ becomes $V_3$, MPB 50 is completely turned off and MNB 52 is completely turned on such that the voltage at $V_b$ is reduced from $V_1 + (V_2 - V_3)$ to $V_4$.

The voltage shift relationship by the present invention shift circuit is shown in FIGS. 5 through 8.

Figure 5:
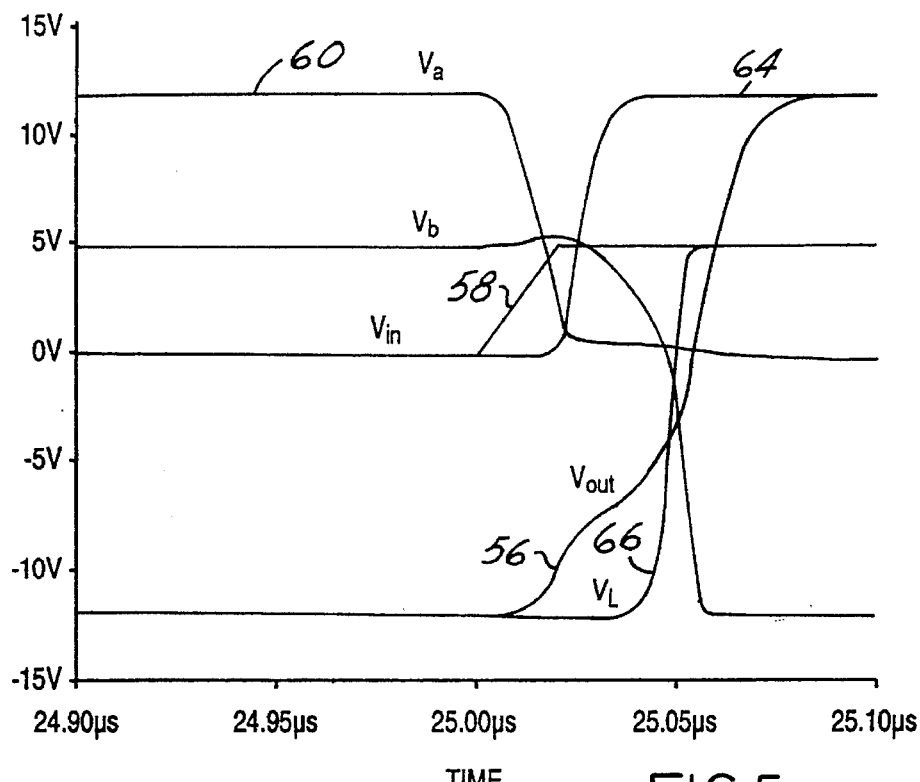
FIGS. 5 and 7 are diagrams showing the various voltage relationships with time in the present invention level shift circuit without a capacitor.

The described process of switching the output voltage $V_{out}$ from the value $V_4$ (−12 V) to the value $V_3$ (+12 V) (curve 56) in response to switching the input voltage ($V_{in}$) from the value $V_1$ (0V) to the value $V_2$ (+5 V) (curve 58) is shown in FIG. 5. Also shown in FIG. 5 are curves 60 for $V_a$ and 62 for $V_6$ for the mentioned direction of voltage switching, as well as curves 64 for $V_a$ and 66 for $V_6$ for the reversed direction of voltage switching.

Figure 6:
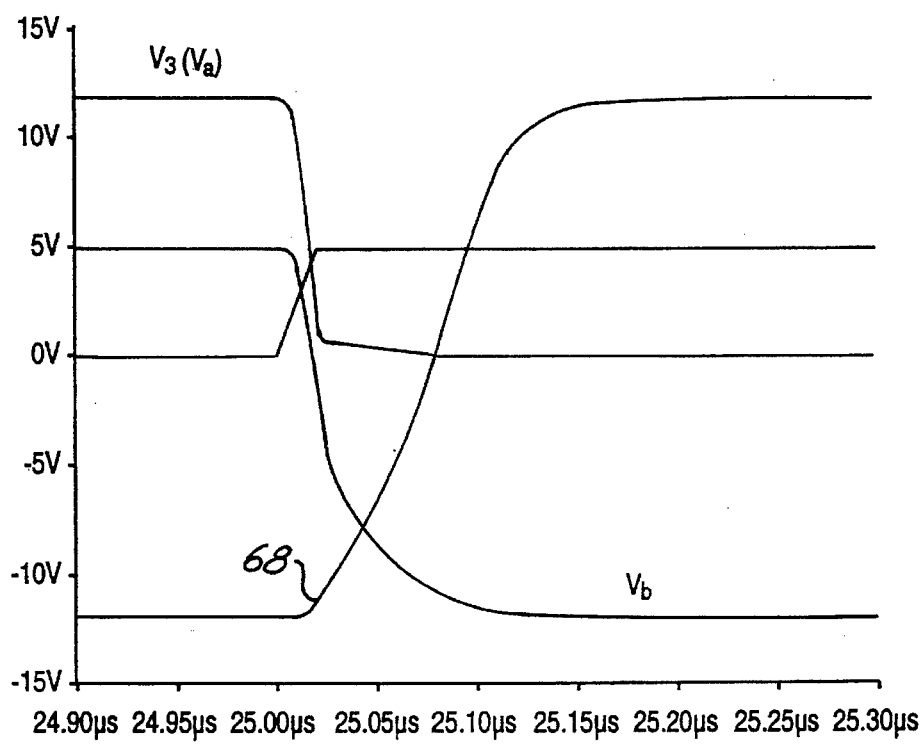
FIGS. 6 and 8 are diagrams showing the various voltage position and time relationships for the present invention level shift circuit equipped with a capacitor.

FIG. 6 illustrates the same process of switching the output voltage $V_{out}$ from the value $V_4$ (−12 V) to the value $V_3$ (+12 V) (curve 68) in response to switching of the input voltage $V_{in}$ from the value $V_1$ (0V) to the value $V_2$ (+5 V) (curve 70) but in the presence of capacitor 54. As it can be seen from the comparison of corresponding curves in FIGS. 5 and 6, changing of $V_6$ in FIG. 6 (curve 72) begins earlier and is performed faster which results in faster switching of the output voltage 68 and in lesser power consumption.

Figure 7:
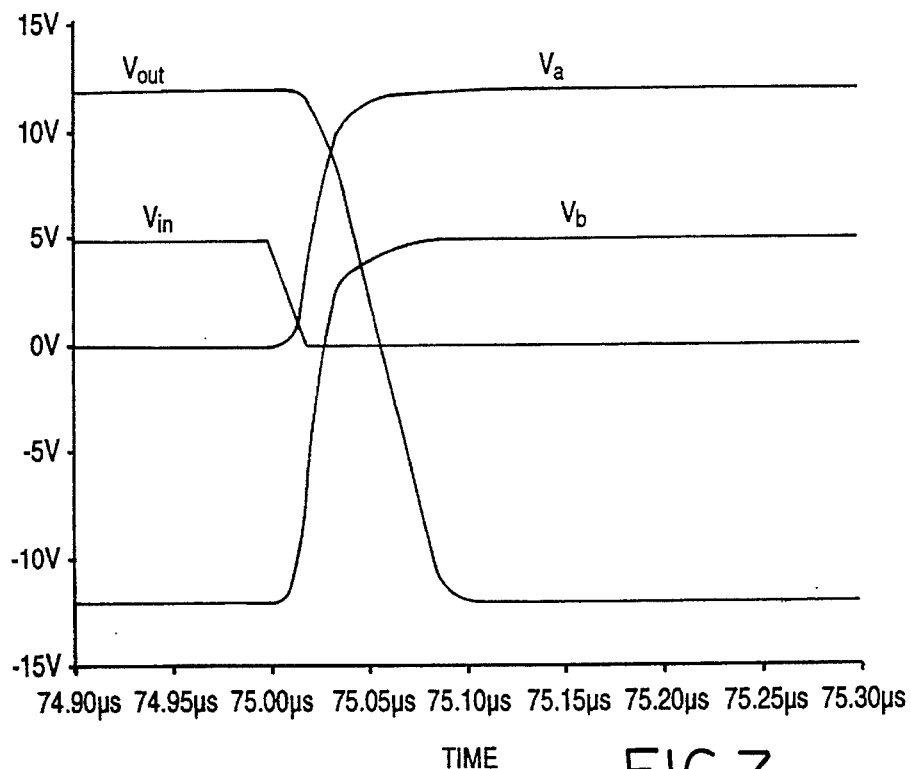
Figure 8:
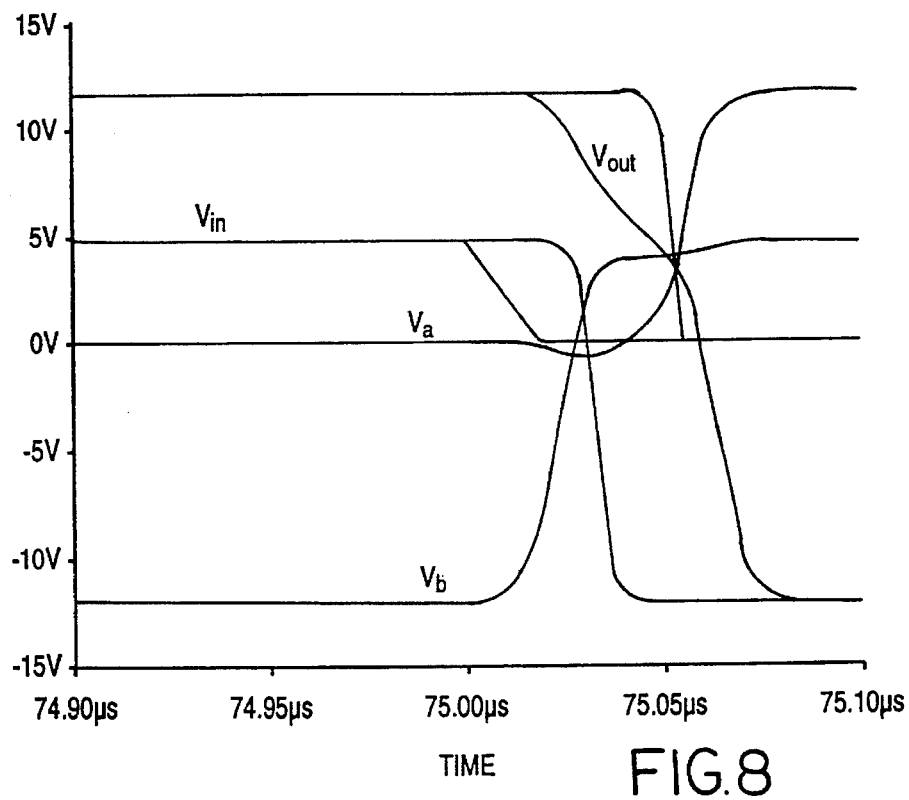

The similar conclusion can be made from the comparison of respective curves in FIGS. 7 and 8. FIG. 7 illustrates the process of voltage level shifting according to the present invention without capacitor 54 whereas FIG. 8 shows the same process in the circuit 40 in presence of capacitor 54. The run of a curve 74 (potential $V_a$ in FIG. 8) shows that its changing commences earlier and is performed faster that contributes to faster switching of the output voltage (curve 76).

It should be understood that though the circuit in accordance with the present invention have been described in detail it may be subjected to modifications and other embodiments incorporating the inventive features. Specifically, there could be used different types of switching elements, instead of those employed in the above description, as well as other alterations obvious for those skilled in the art. Accordingly, it is intended that the foregoing disclosure is to be considered as illustrating the principles of the invention as an example of those features and not as a limiting description, which is the purpose of the claims that follow:

We claim:

1. A voltage level shift circuit for transforming a first voltage range into a second voltage range, said circuit comprising:

a first pair of transistors of the opposite conductivity types connected to each other by their control electrodes, coupled to an input of said circuit and connected to voltage source of said first voltage range;

a second pair of transistors of the opposite conductivity types connected to each other by their output electrodes and connected to a voltage source of said second voltage range, a point of connection of said transistors of said second pair of transistors being an output of said circuit;

a third pair of transistors of the opposite conductivity types connected to each other by their control electrodes and also connected to said source of said second voltage range;

said output of said circuit being connected to said control electrodes of said transistors of said third pair of transistors; and an output electrode of each transistor of said first pair of transistors being connected to an output electrode and to a control electrode of transistors of the opposite conductivity type in said third and said second pair of transistors, respectively.

2. The voltage level shift circuit according to claim 1, further comprising a capacitor connected between said output electrodes of said third pair of transistors.

3. The voltage level shift circuit according to claim 1, wherein each of said first, second and third pair of transistors includes PMOS and NMOS transistors.

4. The voltage level shift circuit according to claim 1, wherein said source of said first voltage range includes 0 to +5 V, whereas said source of said second voltage range includes −12 V to +12 V.

5. A voltage level shift circuit for transforming a low voltage range into a high voltage range, said circuit comprising:

an input pair of transistors of PMOS and NMOS types connected to each other by their control electrodes, coupled to an input of said circuit and connected to a voltage source of said low voltage range;

an output pair of transistors of PMOS and NMOS types connected to each other by their output electrodes and connected to a voltage source of said high voltage range, a point of connection of said transistors of said output pair of transistors being an output of said circuit;

a feedback pair of transistors of PMOS and NMOS types connected to each other by their control electrodes and also connected to said source of said high voltage range to prevent said output pair of transistors from floating;

said output of said circuit being connected to said control electrodes of said feedback pair of transistors; and an output electrode of each transistor of said input pair of transistors being connected to an output electrode and to a control electrode of transistors of the opposite conductivity type in said feedback and said output pair of transistors, respectively.

6. The voltage level shift circuit according to claim 5, further comprising a bootstrap capacitor connected between said output electrodes of said feedback pair of transistors to increase the voltage shift rate.

7. The voltage level shift circuit according to claim 5, wherein said source of said low voltage range includes 0 to +5 V, whereas said source of said high voltage range includes −12 V to +12V.

8. A voltage level shift circuit for transforming a low voltage range into a high voltage range, said circuit comprising:

an input pair of transistors of PMOS and NMOS types connected to each other by their control electrodes, coupled to an input of said circuit and connected to a voltage source of said low voltage range;

an output pair of transistors of PMOS and NMOS types connected to each other by their output electrodes and connected to a voltage source of said high voltage range, a point of connection of said output pair of transistors being an output of said circuit;

a feedback pair of transistors of PMOS and NMOS types connected to each other by their control electrodes and also connected to said source of said high voltage range to prevent said output pair of transistors from floating;

a bootstrap capacitor connected between said output electrodes of said transistors of said feedback pair of transistors to increase the voltage shift rate;

said output of said circuit being connected to said control electrodes of said feedback pair of transistors; and an output electrode of each transistor of said input pair of transistors being connected to an output electrode and to a control electrode of transistors of the opposite conductivity type in said feedback and said output pair of transistors, respectively, whereby said voltage level shift circuit providing a faster voltage level shift rate and thus a faster data transfer rate with lower power consumption.

9. The voltage level shift circuit according to claim 8, wherein said voltage source of said low voltage range includes 0 to +5 V, whereas said source of said high voltage range includes −12 V to +12 V.

* * * * *